(12) United States Patent
Bernard

(10) Patent No.: US 8,179,118 B2
(45) Date of Patent: May 15, 2012

(54) WIDE-BANDWIDTH SPECTRUM ANALYSIS OF TRANSIENT SIGNALS USING A REAL-TIME SPECTRUM ANALYZER

(75) Inventor: Kyle L. Bernard, Tigard, OR (US)

(73) Assignee: Tektronix, Inc., Beaverton, OK (US)

( * ) Notice: Subject to any disclaimer, the term of this patent is extended or adjusted under 35 U.S.C. 154(b) by 503 days.

(21) Appl. No.: 12/092,567

(22) PCT Filed: Nov. 2, 2006

(86) PCT No.: PCT/US2006/060496
§ 371 (c)(1),
(2), (4) Date: May 2, 2008

(87) PCT Pub. No.: WO2007/056673
PCT Pub. Date: May 18, 2007

(65) Prior Publication Data
US 2008/0258706 A1     Oct. 23, 2008

Related U.S. Application Data

(60) Provisional application No. 60/733,521, filed on Nov. 4, 2005.

(51) Int. Cl.
*G01R 23/16* (2006.01)
*H04B 1/18* (2006.01)
(52) U.S. Cl. .................................. 324/76.22; 455/192.3
(58) Field of Classification Search ............... 324/76.22; 455/192.3
See application file for complete search history.

(56) References Cited

U.S. PATENT DOCUMENTS

| | | | |
|---|---|---|---|
| 4,843,309 A | | 6/1989 | Kareem et al. |
| 5,260,648 A | * | 11/1993 | Brust .................... 324/158.1 |
| 6,229,998 B1 | | 5/2001 | Hamdy et al. |
| 6,233,529 B1 | * | 5/2001 | Nonaka .................... 702/76 |
| 6,512,788 B1 | | 1/2003 | Kuhn et al. |

(Continued)

FOREIGN PATENT DOCUMENTS

JP     H06-18573     1/1994

(Continued)

OTHER PUBLICATIONS

U.S. Appl. No. 11/858,088 titled "Signal Analyzers and Frequency Domain Data Production Method" filed Sep. 19, 2007 to Miyake Kenichi et al.

(Continued)

*Primary Examiner* — Jeff Natalini
(74) *Attorney, Agent, or Firm* — Chris Tuttle; Michael A. Nelson

(57) ABSTRACT

A system and method for performing wide-band spectral analysis of transient signals using a real-time spectrum analyzer (RTSA). A frequency window is selected for RTSA acquisition, the frequency window being narrower in bandwidth than the frequency spectrum of interest. An RTSA is successively tuned to a plurality of different frequencies within the frequency spectrum of interest, where such successive tuning is controlled based on a characteristic of the signal. The RF signal is received, and, for each of the plurality of different frequencies, power data is acquired for the signal in a band centered on the frequency and having a bandwidth equal to that of the frequency window. A representation of the frequency spectrum of interest is then constructed from the power data acquired during the successive tunings of the RTSA.

24 Claims, 3 Drawing Sheets

U.S. PATENT DOCUMENTS

| | | |
|---|---|---|
| 6,714,605 B2 | 3/2004 | Sugar et al. |
| 6,850,735 B2 | 2/2005 | Sugar et al. |
| 7,257,497 B2 | 8/2007 | Pickerd |
| 7,729,872 B2 * | 6/2010 | Obata .............................. 702/67 |
| 2005/0002473 A1 | 1/2005 | Kloper et al. |
| 2005/0021261 A1 | 1/2005 | Nara |

FOREIGN PATENT DOCUMENTS

| | | |
|---|---|---|
| JP | 2005055412 A | 3/2005 |
| JP | 2005265535 A | 9/2005 |

OTHER PUBLICATIONS

Final Rejection in U.S. Appl. No. 11/858,088 dated Sep. 10, 2010.
Non-Final Rejection in U.S. Appl. No. 11/858,088 dated Apr. 23, 2010.
Non-Final Rejection in U.S. Appl. No. 11/858,088 dated Nov. 4, 2009.
Advisory Action in U.S. Appl. No. 11/858,088 dated Oct. 22, 2010.
Notice of Allowance in U.S. Appl. No. 11/858,088 dated Jan. 13, 2011.

* cited by examiner

WIDE-BANDWIDTH SPECTRUM ANALYSIS OF TRANSIENT SIGNALS USING A REAL-TIME SPECTRUM ANALYZER

CROSS-REFERENCE TO RELATED APPLICATION(S)

This application claims the benefit of U.S. Provisional Application No. 60,733,521 filed Nov. 4, 2005, the entire contents of which are incorporated herein by this reference for all purposes.

BACKGROUND

Spectrum analyzers have long been used to perform frequency analysis on RF signals. Various types of spectrum analyzers exist; one of the newer varieties is a real-time spectrum analyzer (RTSA). RTSA devices leverage modern increases in computing power to perform near-instant frequency-domain transformations on RF signals. A relatively wide range of frequencies can be monitored and updated simultaneously, in contrast to swept spectrum analyzers, which monitor frequency domain information only over a relatively narrow bandwidth at any given instant in time.

By allowing a real-time view of spectral events, RTSA devices are very useful in modern RF environments, which have increased in complexity to include transient characteristics that cannot be analyzed with traditional swept spectrum devices. Current RTSA devices do, however, have bandwidth limitations. Accordingly, as the spectrum of interest increases in bandwidth, the ability of an RTSA to provide a real-time spectral representation diminishes.

DETAILED DESCRIPTION

Figure 1:
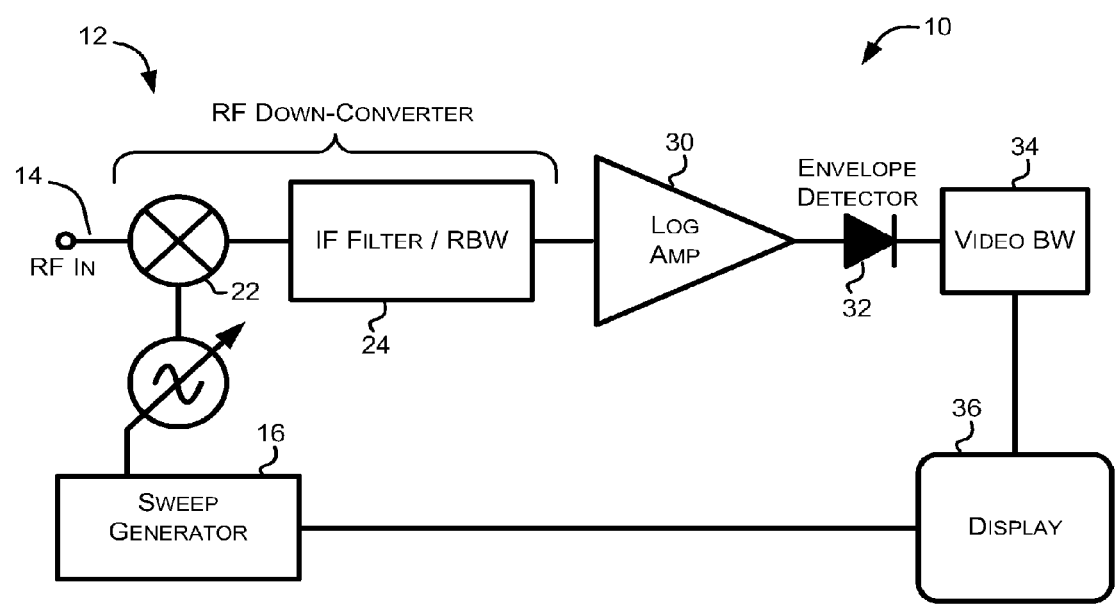
FIG. 1 is a schematic depiction of a swept spectrum analyzer.

FIG. 1 schematically depicts a swept spectrum analyzer 10. Front end 12 of analyzer 10 includes an input 14 for receiving a signal to be analyzed. The front end of the analyzer also includes an adjustable sweep generator 16 having an output that feeds mixer 22, which also receives the incoming signal to be analyzed. The output of mixer 22 is filtered by IF filter/RBW block 24. Mixer 22 and filter 24 perform RF down-conversion and the resulting signal is amplified (e.g., by amplifier 30), envelope detected (e.g., via 32) and video filtered by video BW 34. The resulting signal is displayed on display 36, typically on the y-axis of the display. In other words, the RF front end is swept across the frequency range of interest. The circuitry operates to filter, detect and display the RF power at each frequency in the sweep.

Typically, analyzer 10 is configured to provide a continuous frequency sweep that is capable of measuring RF power over very wide frequency bands. In addition to having excellent frequency coverage, typical embodiments of analyzer 10 have a high dynamic range and good local oscillator phase noise performance.

Swept spectrum analyzers are not ideal for all applications, however. The frequency pre-selector at the front end of the analyzer and the IF filter/resolution bandwidth are narrow-band, and the analyzer thus presents only a small bandwidth of data at any given time. Swept spectrum analyzers cannot provide real-time measurement of RF signal frequency components. That is, even though the viewed spectrum may be very wide, only the frequency at which the sweep is currently located can be measured at any particular time. The unanalyzed, blanked-out periods between sweeps can be problematic, particularly for signals exhibiting transient phenomena, such as bursting, frequency hops, etc.

Figure 2:
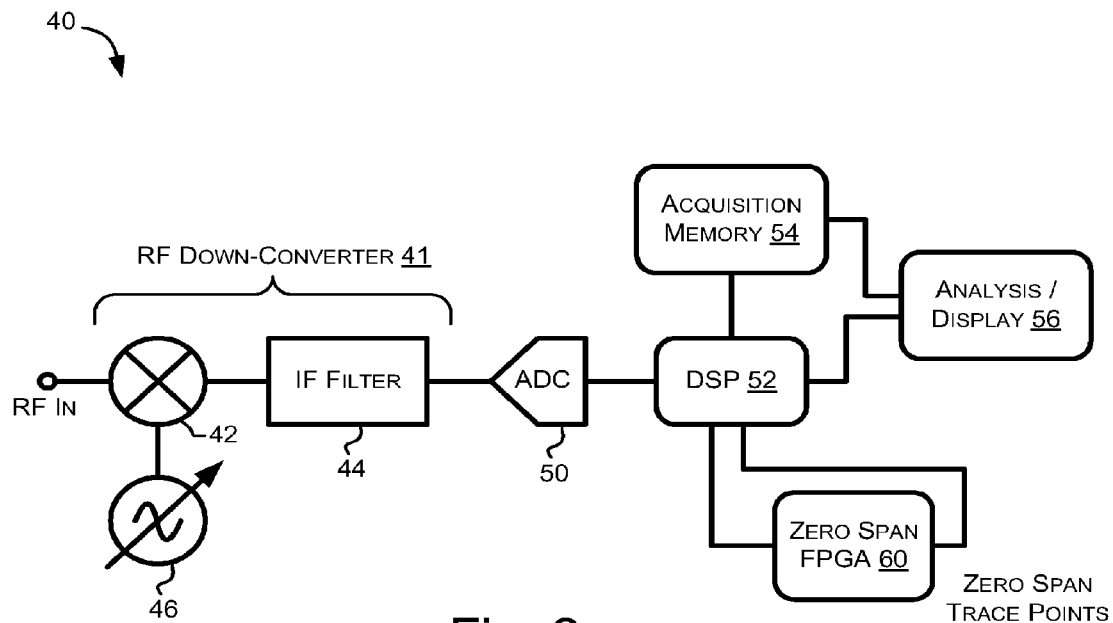
FIG. 2 is a schematic depiction of a real-time spectrum analyzer (RTSA).

FIG. 2 schematically depicts a different type of device for performing spectral analysis, which will be referred to herein as a real-time spectrum analyzer (RTSA). Similar to analyzer 10, the depicted analyzer (indicated generally at 40) has a front end RF down-converter 41, including a mixer 42 and filter 44, that receives an input RF signal and is tunable (via 46) so as to analyze a frequency or range of frequencies for the incoming RF signal. Front-end down-converter 41 is configured to down-convert any signal within the frequency range of the instrument (e.g., 8 GHz) to an IF signal. In contrast to the previous analyzer, the front end of RTSA 40 is step-tuned, and the IF bandwidth of the RTSA is generally wider than a traditional SA. That is, the front end of the analyzer is tuned discretely to cover a range of frequencies, instead of being swept across a spectrum of interest. In other words, the swept spectrum analyzer is tuned to a relatively narrow bandwidth, but is swept across the spectrum of interest, whereas the RTSA has a front end that is tuned to cover the spectrum of interest without being swept.

The RTSA 40 thus has a much wider capture bandwidth than that of the swept spectrum analyzer 10. In the RTSA, the IF signal (i.e., downstream of the down-converter) is sampled and digitized over the entire capture bandwidth of the RTSA using a high-speed analog to digital converter 50. This produces a seamless time domain representation of the RF signal coming out of the ADC. Prior to capture, DSP 52 performs real-time processing such as sample rate conversion and flatness and phase correction in the time domain. The RTSA architecture allows the input signal to be seamlessly captured with no gaps in time by digitizing the RF signal and storing the time-contiguous samples in memory. As explained below, it will often be desirable to set the capture bandwidth of the RTSA at a level less than the maximum possible for the device. The real-time capture and front-end processing also allows the RF signal to be analyzed simultaneously in the time, frequency and modulation domains. RTSA also typically includes a memory 54 and display 56. A zero-span FPGA 60 may also be provided, which is configured to facilitate generation of filtered time-domain representations and signal power calculations in real time.

Due to its ability to process spectral data in real time, and its ability to perform a wide band analysis using a series of relatively narrow-band time-domain power measurements, the RTSA of FIG. 2 may be employed to advantage in a variety of settings. The RTSA may even be used to analyze very wide frequency domain distributions. In some cases, the frequency domain distribution will be wider than the maximum capture bandwidth of the RTSA. For example, certain pulsed RF signals with narrow pulse widths can produce wide frequency domain distributions.

Assume, for example, that the maximum capture bandwidth of an RTSA device is 110 MHz, while the frequency range of interest is 500 MHz wide. In such a case, the RTSA cannot capture the entire range at once in real-time.

To capture the frequency domain representation for the entire spectrum, it may therefore be desirable to tune the RTSA 40 to multiple different portions of the desired spectrum to be obtained. Signal power information at multiple different frequencies may then be combined to form a frequency domain trace for the relatively wide spectrum of interest. In this way, the RTSA is operated in a manner similar to the swept spectrum analyzer. In particular, the analyzer is tuned to different locations in the spectrum to obtain the frequency information (e.g., signal power levels) for the corresponding portion of the spectrum.

One approach includes successively tuning the RTSA stepwise across the frequency range of interest. While at each tuned location, the RTSA obtains power information for that location, such as the peak power level in the frequency band. However, to produce the correct spectrum for transient signals containing spectral components over wide frequency ranges, each portion of the desired span (stitch) must be captured when the signal characteristic of interest (e.g., an RF pulse) is present.

Using the step-wise tuning method without any reference to when the signal characteristic is present can result in slow spectrum acquisition. If the RTSA is rapidly stepped through the entire spectrum to be acquired, it is possible that at any given tuning, the portion of the RF signal containing components in the tuning bandwidth will not occur. In some cases, the RTSA will have to cycle through the entire spectrum of interest several times before, for a given band, the RTSA timing coincides with the corresponding in-band frequency components of the signal being analyzed.

Another approach involves use of an external trigger to attempt to synchronize the tuning of the RTSA with the signal being analyzed. Typically the external trigger is generated using the signal to be analyzed, and thus requires having access to the signal source. Alternatively, an external trigger may be generated or inferred based on analysis of the received signal; however, this approach can require additional hardware and complexity. Where employed, however, the external trigger may be used to intelligently tune the RTSA so as to minimize the time required to obtain power information across the entire spectrum. Where the external trigger is possible and practicable, it provides an improvement over the previous unsynchronized example. The improvement results from the reduction in time that the RTSA must be tuned to a given band in order to obtain the relevant power information for frequency components occurring in that band.

Instead of an external trigger, an internal trigger may be generated by the spectrum analyzer. This may be accomplished using existing internal triggers such as the frequency mask trigger or power trigger, for example. In some cases, this may require multiple variable frequency mask or power trigger levels (as many as one for each stitched segment of the spectrum). Additionally, depending on signal characteristics, some frequencies in the span may actually contain no signal power on which to trigger. In many settings, this method is significantly limited by the presence of only one RF signal path in typical RTSA configurations.

Figure 3:
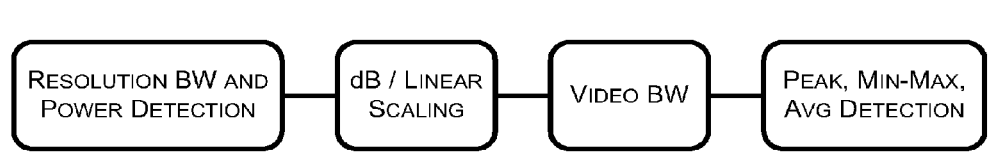
FIG. 3 is a schematic depiction of a zero-span FPGA component which may be implemented in connection with the analyzer of FIG. 2 to facilitate improved wide-bandwidth RTSA analysis.
Figure 4:
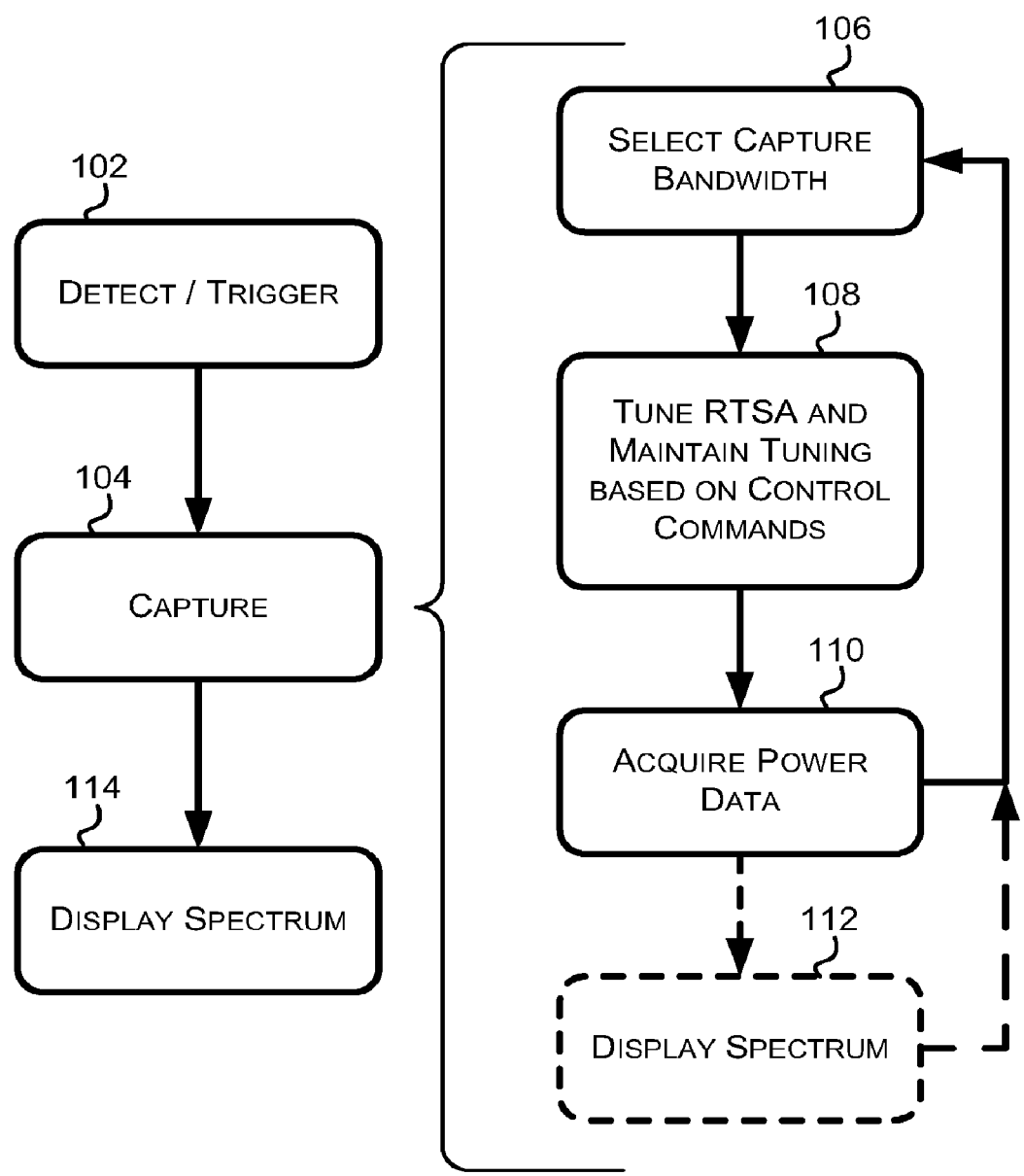
FIG. 4 depicts an exemplary method for performing wide-bandwidth spectral analysis using an RTSA device.

Referring now to FIGS. 3 and 4, a further approach for using an RTSA device is depicted. The exemplary methods will be described primarily in connection with the device embodiments discussed above. It should be appreciated, however, that the methods may be employed with different devices, and/or with combinations of devices.

The methods may be employed in a variety of different settings, though they have proved particularly useful in developing spectral representations for transient signals where the frequency range of interest exceeds the capture bandwidth employed by the RTSA. This can happen as a result of the spectrum of interest being wider in bandwidth than the maximum capture bandwidth capability of the RTSA device. For example, some RTSAs have a maximum capture bandwidth of 110 MHz. The method examples described herein could therefore be employed with such a device to analyze a signal having a 500 MHz spectral distribution. In such a situation, the RTSA device may be employed in a zero-span mode, with intra-spectrum tuning- and re-tuning being synchronized based on pulse repetition rate or some other characteristic of the examined signal. In addition, it may be advantageous in some cases to intentionally set the capture bandwidth of the RTSA to less than the maximum capture capacity of the device. Then, to the extent that the capture bandwidth is narrower than the desired spectral distribution, the method may also be used advantageously to analyze the spectrum with a higher degree of resolution.

To employ an RTSA in the manner described herein, a zero-span FPGA 60 may be employed. In the example of FIG. 3, FPGA 60 is configured to receive output from DSP 52 and generate trace points based on detected power levels in the frequency band at which the RTSA device is tuned. The zero-span capability and power detection features are described in more detail below.

Referring now to FIG. 4, at 102, the method may initially include detecting or triggering on a spectral event of interest. Such detection may be enabled via a frequency-dependent mask implemented within the RTSA device. Once the event of interest occurs, the method includes entering a capture control routine, as shown at 104. It will be appreciated however, that the triggering step may be omitted in many applications. Indeed, as explained below, one advantage of the described exemplary method is that it may be employed to efficiently perform wide-band analysis independent of a trigger or any particular spectral event.

During capture control, an acquisition window is selected, as shown at 106. The acquisition window may also be referred to as the frequency window or capture bandwidth. As discussed above, in some cases this will simply be the maximum capture bandwidth of the RTSA device, while in other cases a narrower frequency window may be employed, as dictated by desired resolution or other considerations.

At 108, the RTSA device is then tuned to a location in the spectrum of interest. Typically, each tuning is maintained for a time interval. The interval (e.g., the time during which the power measurement is done for the particular frequency point) may be controlled based on a characteristic of the examined signal, such as pulse width, as described in more detail below. During capture control (i.e., the tuning to the different frequency locations in the spectrum of interest, and the time interval over which each tuning is maintained), power data may be obtained for each tuned location (110), and the resulting captured data may be used to update a display of the spectrum of interest (112).

As indicated in the figure, capture typically involves multiple successive tunings of the RTSA device to different locations (bands) in the spectrum of interest. The tunings for the sub-spectrum bands may be selected, ordered and/or timed to achieve any desired tuning scheme. For example, the RTSA may be tuned step-wise successively across the spectrum of interest, remaining at each tuned location for the same amount of time. Alternatively, the resolution and/or timing may be location-dependent, such that, at some frequencies, the resolution of the resulting spectrum is higher or lower than at other locations. The timing may also vary according to the location in the spectrum. In addition, instead of stepping through the spectrum from lower to higher frequency bands, or vice versa, the tuning may jump around the spectrum of interest in order to acquire all the power level traces for the stitching process.

Typically, the timing, resolution and/or other parameters are selected to efficiently generate the desired spectrum. Indeed, it will often be desirable to generate the spectrum by tuning the RTSA to each location in the span only once per trace update, or to otherwise employ strategies to reduce the time needed to generate the spectrum of interest.

Efficient spectrum generation may be achieved in some settings by controlling the timing of the RTSA tuning based on a characteristic of the incoming signal. For example, the RTSA timing may be triggered or synchronized based on pulse width, pulse repetition rate, pulse off/on time/duty factor of a pulsed RF signal being analyzed. As an example, pulse repetition rate may be a determining factor for re-tuning while pulse width may be used for time interval control, but embodiments are not limited to these applications. Further, the RTSA tuning performed at 108 (i.e., the "capture control") may be maintained for an interval based on pulse width (e.g., an estimation of pulse width derived from initial signal analysis). Pulse-width based capture control of the RTSA tuning may ensure that while the RTSA is tuned to a particular location, the system will in fact receive a signal component corresponding to the tuned frequency band. In other words, the pulse-width based capture control ensures that a given band tuning is maintained for a sufficiently long time interval for the spectral events corresponding to that band to occur. Also, pulse-width control typically is implemented so that the tunings are maintained no longer than necessary for the spectral events to occur, so as to minimize time needed for generation of the desired spectrum.

Accordingly, the successive tuning to stitch together the desired spectrum may include (a) selecting the capture bandwidth; (b) selecting the time that the RTSA is tuned to a given location; and/or (c) selecting the order or sequence in which the tunings occur—e.g., increasing from stitch to stitch, decreasing, or randomly or in some controlled scheme other than merely increasing or decreasing.

The power data obtained at 110 may include one or more of: (1) obtaining peak power level for the band during the interval; (2) obtaining the minimum power level for the band; and (3) obtaining average power for the band.

As shown at 112, the displayed spectrum may be updated upon obtaining the power level data. Additionally or alternatively, after all of the power levels are obtained, the spectrum of interest may be stitched together by combining all of the acquired power data for the spectrum of interest, as shown at 114.

Referring still to the capture features described with reference to FIG. 4, the synchronization of the RTSA tuning may dynamically adapt over time as more information is gained about the analyzed signal. For example, pulse width based interval control may be implemented initially using a rough estimate of the pulse width. As more information is obtained about the signal, a more accurate estimate may be obtained, enabling adjustment to the RTSA tuning synchronization (e.g., through use of an updated estimate). In addition, the tuning may initially be completely untriggered, and simply cycle through the spectrum of interest at a pre-set re-tuning rate. During this mode, some information about the signal is gained. At some point, sufficient information has been obtained to allow a pulse width, pulse repetition rate, pulse off/on time/duty factor, etc., estimate to be made, at which point that estimate can be used to control the timing of RTSA tuning.

While the present embodiments and method implementations have been particularly shown and described, those skilled in the art will understand that many variations may be made therein without departing from the spirit and scope of the invention. The description should be understood to include all novel and non-obvious combinations of elements described herein, and claims may be presented in this or a later application to any novel and non-obvious combination of these elements. Where claims recite "a" or "a first" element or the equivalent thereof, such claims should be understood to include incorporation of one or more such elements, neither requiring nor excluding two or more such elements.

What is claimed is:

1. A method of performing spectral signal analysis on a signal in a frequency spectrum of interest, comprising:
    selecting a frequency window for real-time spectrum analyzer (RTSA) acquisition, the frequency window being narrower in bandwidth than the frequency spectrum of interest;
    successively tuning a down-converter of an RTSA to a plurality of different frequencies within the frequency spectrum of interest, where such successive tuning is controlled based on a characteristic of the signal;
    receiving the signal and, for each of the plurality of different frequencies, acquiring power data for the signal in a band centered on the frequency and having a bandwidth equal to that of the frequency window; and
    constructing a representation of the frequency spectrum of interest from the power data acquired during the successive tunings of the down-converter of the RTSA.

2. The method of claim 1, where the characteristic is at least one of a pulse width, pulse repetition rate, and a pulse off/on time/duty factor, and where the method includes timing the successive tuning of the down-converter of the RTSA based on an estimate of the characteristic.

3. The method of claim 2, where timing the successive tuning of the down-converter of the RTSA based on an estimate of the characteristic includes employing an initial pulse width estimate and then a subsequently-obtained refined estimate of the characteristic.

4. The method of claim 1, where the frequency window and the plurality of different frequencies are selected so as to substantially span the entire frequency spectrum of interest.

5. The method of claim 1, where the successive tuning is initially timed based on an initial estimate of the characteristic of the signal, and then subsequently timed based on an updated estimate of the characteristic of the signal.

6. The method of claim 1, further comprising displaying the representation of the frequency spectrum of interest on a display device.

7. The method of claim 1, where acquiring power data includes acquiring a peak power level for the band.

8. The method of claim 1, where acquiring power data includes acquiring an average power level for the band.

9. The method of claim 1, where acquiring power data includes acquiring a minimum power level for the band.

10. An electronic measurement device, comprising:
    a tunable receiver configured to receive a signal;
    an analog to digital converter (ADC) operatively coupled with the tunable receiver;
    a digital signal processor (DSP) configured to perform pre-capture real-time processing of time domain digital signals received from the ADC, such real-time processing being performed across a frequency band selected via operation of the tunable receiver;

a controller and memory operatively coupled with the tunable receiver and DSP, the controller and memory being configured to:

cause a down-converter of the tunable receiver to be successively tuned to each of a plurality of different bands in a frequency spectrum of interest, each of the bands having a narrower bandwidth than the frequency spectrum of interest;

cause the DSP to generate, for each of the plurality of different bands, a time-domain sample in the respective band of a received digital signal, to be stored in the memory; and obtain, for each of the plurality of different bands, a power level for the respective time-domain sample, where the controller is configured to construct, from the power levels obtained for each of the plurality of different bands, a frequency trace of the received digital signal for the frequency spectrum of interest.

11. The electronic measurement device of claim 10, where the controller is configured to control the successive tuning of the tunable receiver based on a characteristic of the received digital signal.

12. The electronic measurement device of claim 11, where the characteristic is at least one of a pulse width, pulse repetition rate, and a pulse off/on time/duty factor of the received digital signal.

13. The electronic measurement device of claim 12, where the controller is configured to cause the tunable receiver to maintain the tuning to each of the plurality of different bands for a time interval which is determined based on the pulse width, pulse repetition rate, or pulse off/on time/duty factor of the received digital signal.

14. A method of performing spectral analysis on an RF signal, comprising:

tuning a down-converter of a real-time spectrum analyzer (RTSA) to a first range of frequencies, the first range of frequencies being within an expected spectral distribution of the RF signal and narrower in bandwidth than such spectral distribution;

maintaining the down-converter of the RTSA tuned to the first range of frequencies during an interval, where the duration of the interval is controlled based on a characteristic of the RF signal;

during the interval, operating the RTSA so as to obtain power data for the RF signal in the first range of frequencies; and upon ending of the interval, re-tuning the down-converter of the RTSA to a second range of frequencies, the second range of frequencies being within and narrower in bandwidth than the expected spectral distribution, where such re-tuning is performed to obtain power data for the RF signal in the second range of frequencies.

15. The method of claim 14, where obtaining power data for the first and second range of frequencies includes obtaining a minimum power level in each of the frequency ranges.

16. The method of claim 14, where obtaining power data for the first and second range of frequencies includes obtaining a peak power level in each of the frequency ranges.

17. The method of claim 14, where obtaining power data for the first and second range of frequencies includes obtaining an average power level in each of the frequency ranges.

18. The method of claim 14, further comprising successively re-tuning the down-converter of the RTSA to a plurality of additional frequency ranges within the expected spectral distribution and obtaining power data for such additional frequency ranges.

19. The method of claim 18, further comprising combining the power data obtained for the frequencies to generate a spectral representation of the RF signal.

20. The method of claim 18, where the successive re-tunings of the down-converter of the RTSA are synchronized based on a pulse width, pulse repetition rate, and a pulse off/on time/duty factor of the RF signal.

21. A method of conducting spectral analysis on an RF signal for a frequency spectrum of interest, comprising:

performing a plurality of zero-span power level measurements at different frequency locations in the frequency spectrum of interest using a real-time spectrum analyzer (RTSA), each of the zero-span power level measurements being performed in succession as follows:

(a) tuning a down-converter of the RTSA to the frequency location and employing an RTSA capture bandwidth which is narrower than the frequency spectrum of interest;

(b) maintaining the tuning of the down-converter of the RTSA at the tuned frequency location for a time interval; and (c) measuring a power level for the frequency location during the time interval and storing said power level; and constructing, from the power levels measured for the different frequency locations in the frequency spectrum of interest, a frequency-domain trace for the frequency spectrum of interest.

22. The method of claim 21, further comprising, for each of the different frequency locations, controlling a timing at which the tuning is initiated and controlling the length of the time interval during which the tuning is maintained, where in both instances said control is based on at least one of a pulse width, pulse repetition rate, and a pulse off/on time/duty factor of the RF signal.

23. The method of claim 22, where in both instances said control is performed independent of triggers generated from the RF signal.

24. The method of claim 22, where said control increases an update rate of the frequency-domain trace.

* * * * *